(12) United States Patent
Jones et al.

(10) Patent No.: US 11,933,843 B2
(45) Date of Patent: Mar. 19, 2024

(54) TECHNIQUES TO ENABLE INTEGRATED CIRCUIT DEBUG ACROSS LOW POWER STATES

(71) Applicant: Intel Corporation, Santa Clara, CA (US)

(72) Inventors: Keith A. Jones, Forest Grove, OR (US); Wai Mun Ng, Bukit Mertajam (MY); Thomas A. Lyda, Folsom, CA (US); Subinlal Pk, Kozhikode (IN); Sankaran Menon, Austin, TX (US); Vui Yong Liew, Bukit Mertajam (MY); Kristan K. Wiseley, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 144 days.

(21) Appl. No.: 17/377,264

(22) Filed: Jul. 15, 2021

(65) Prior Publication Data
US 2022/0018901 A1   Jan. 20, 2022

Related U.S. Application Data

(60) Provisional application No. 63/053,421, filed on Jul. 17, 2020.

(30) Foreign Application Priority Data

Jul. 17, 2020  (IN) ............................. 202041030496
Jul. 17, 2020  (MY) ............................ PI2020003707

(51) Int. Cl.
G01R 31/317    (2006.01)
G01R 31/3183   (2006.01)
G01R 31/3185   (2006.01)

(52) U.S. Cl.
CPC . *G01R 31/31721* (2013.01); *G01R 31/31705* (2013.01); *G01R 31/318314* (2013.01); *G01R 31/318533* (2013.01)

(58) Field of Classification Search
CPC ........ G01R 31/31903; G01R 31/31905; G01R 31/31907; G01R 31/31908;
(Continued)

(56) References Cited

U.S. PATENT DOCUMENTS 7,315,897 B1 *  1/2008  Hardee ................... H04L 45/00
                                                                 709/224
9,116,785 B2 *  8/2015  Ferry ...................... G06F 17/00
(Continued)

OTHER PUBLICATIONS

S. Menon et al., "Techniques for Debug of Low Power SoCs," 2019 20th International Workshop on Microprocessor/SoC Test, Security and Verification (MTV), Austin, TX, USA, 2019, pp. 45-49.*

*Primary Examiner* — Steve N Nguyen
(74) *Attorney, Agent, or Firm* — Schwabe, Williamson & Wyatt, P.C.

(57) ABSTRACT

An Automated Dynamic low voltage monitoring (LVM) based Low-Power (ADLLP) debug capability for a system-on-chip (SoC) as well as the open/closed-chassis platform for faster TTM (Time to Market) of the final platform or system. ADLLP Debug is achieved by detection of the probe connection between a target system (e.g., SoC) and debug host system. A user can dynamically override the power, clocks and LVM for intellectual property (IP) blocks not part of the debug trace by instructing a Power Management Controller (PMC) via the Inter Processor Communication (IPC) mailbox (or any other suitable mailbox driver) to set the registers in a Target Firmware (TFW) based on the probe and debug use-case.

24 Claims, 4 Drawing Sheets

(58) Field of Classification Search
CPC ........ G01R 31/31705; G01R 31/31721; G01R 31/318314; G01R 31/318533; G06F 11/3003; G06F 11/3062; G06F 11/3656
See application file for complete search history.

(56) References Cited

U.S. PATENT DOCUMENTS

| | | | |
|---|---|---|---|
| 9,689,919 B2* | 6/2017 | Zhao | G11C 29/26 |
| 10,054,636 B2* | 8/2018 | Kuehnis | G01R 31/31705 |
| 10,816,598 B1* | 10/2020 | Merugu | G01R 31/3177 |
| 2007/0113218 A1* | 5/2007 | Nolan | G06F 11/362 717/124 |
| 2008/0054917 A1* | 3/2008 | Henson | G01R 31/2889 324/754.03 |
| 2011/0276302 A1* | 11/2011 | Rivoir | G01R 31/31926 702/117 |
| 2014/0207402 A1* | 7/2014 | Ferry | H04L 69/03 702/119 |
| 2015/0082093 A1* | 3/2015 | Sarangi | G01R 31/31705 714/30 |
| 2016/0047859 A1* | 2/2016 | Deutsch | G01R 31/31705 714/734 |
| 2017/0035395 A1* | 2/2017 | Ryu | A61B 8/4427 |

* cited by examiner

TECHNIQUES TO ENABLE INTEGRATED CIRCUIT DEBUG ACROSS LOW POWER STATES

CROSS REFERENCE TO RELATED APPLICATION

The present application claims priority to U.S. Provisional Patent Application No. 63/053,421, which was filed Jul. 17, 2020, Indian Provisional Patent Application No. 202041030496, which was filed Jul. 17, 2020, and Malaysian Provisional Patent Application No. PI2020003707, which was filed Jul. 17, 2020, all of which are hereby incorporated by reference.

FIELD

Embodiments herein relate generally to the field of electronic circuits and, more specifically, to circuits for debug in low power states.

BACKGROUND

Low power debug is a difficult problem to solve for system-on-chips (SoCs) as well as platform debug of computing systems due to a multitude of challenges. Some of the challenges are associated due to design/implementation related issues, such as power/clock(s) being gated off to save power in the various partitions of the SoC. Others are related to heisenbugs (e.g., unusual bugs that disappear or alter behavior when an attempt is made to measure the power), while other challenges are associated to meet regulatory compliance, such as California Energy-Star requirements etc. Power dissipation on small form-factor designs during debug impact the battery-life as well as the product itself. At times, the low power debug design also inhibits debuggers the ability to do invasive debug due to the fact that circuit blocks (e.g., intellectual property blocks (IPs)) are required to be in low power mode. In addition, the system invariably would come out of low-power mode upon plugging-in the debug probe (an indirect heisenbug situation), which is very difficult to avoid unless special care is taken.

BRIEF DESCRIPTION OF THE DRAWINGS

The embodiments of the disclosure will be understood more fully from the detailed description given below and from the accompanying drawings of various embodiments of the disclosure. However, while the drawings are to aid in explanation and understanding, they are only an aid, and should not be taken to limit the disclosure to the specific embodiments depicted therein.

DETAILED DESCRIPTION

Figure 1:
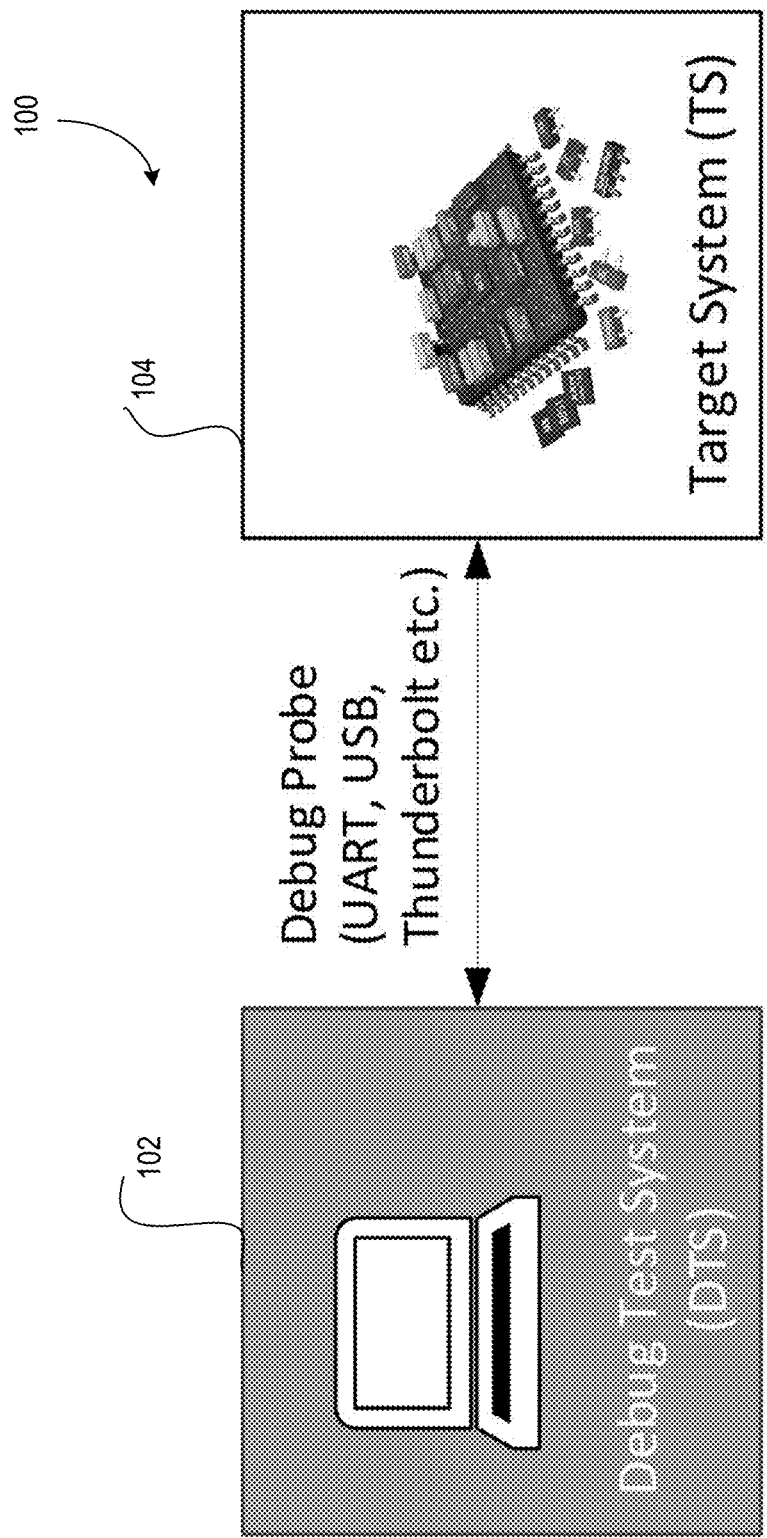
FIG. 1 illustrates a debug setup showing a Debug Test System (DTS) connected to a Target System (TS), in accordance with some embodiments of the disclosure.

Meeting regulatory compliance, such as California's Energy-Star requirements that are very stringent, requires that a system to be shipped with monitor enabled to sleep after 15 minutes of idle and the entire system required to sleep after 30 minutes. There are additional requirements on C-state or also known as Core-states (Cx states), as defined by Advanced Configuration and Power Interface (ACPI) specification Version 6.2, January 2019, to lower the power by making sure that the system meets the C-state latency requirements. All these requirements can be met if effective low-power debug capabilities are implemented in the SoC as well as platform to enable effective debug before shipping the products.

Existing solutions rely on users to navigate to the System Firmware (SFW) graphics user interface (GUI) setup, also known as basic input/output system (BIOS), and change the debug configuration or IFWI (Intel® Integrated Firmware Image) to tune the power and clocks and reboot the system to enter each particular low-power state according to debug needs. However, debug engineers find this flow a painful process which impacts system performance even when the probe is not connected.

These existing solutions require a lot of manual process, which is error-prone and often requires an expert to tune the system to enter the low-power states. Due to the complexity of low-power debug and tendency of entering heisenbug situations, low-power debug is a time-consuming process impacting silicon TTM (Time-to-Market). The complexities and expertise needed for low-power debug, has excluded original equipment manufacturers (OEMs) from performing low-power debug of in-field systems. Additionally, rebooting the system will cause the failure to disappear and the overrides also may go away, and may take weeks to replicate the failure(s).

Various embodiments provide an Automated Dynamic low voltage monitoring (LVM) based Low-Power (ADLLP) debug capability for SoC as well as the open/closed-chassis platform for faster TTM (Time to Market) of the final platform or system. Various embodiments enable a user to dynamically override the power, clocks and/or LVM by instructing a Power Management Controller (PMC) via the Inter Processor Communication (IPC) mailbox (or any other suitable mailbox driver) to set the registers in a Target Firmware (TFW) based on the probe and debug use-case.

There are many technical effects of the various embodiments. For example, ADLLP debug capability allows customers to dynamically change debug probes/transports for the various debug use-cases to perform low-power debug automatically. Customers may not need to worry about configuring the Target Firmware to support debug or they do not need to override LVM manually. The solution of various embodiments helps customers to save power during debug, which is useful for debug using batteries (e.g., without an alternating current (AC) brick supply source), as the time to debug is limited by the amount of charge available in the batteries. The scheme of various embodiments also helps customers with the ability to debug small form-factor devices as well as to debug in-field, where AC brick supply sources may not be easily available. OEMs are able to do debug through low-power states which they could not in previous generations, reducing TTM (Time to Market).

Additionally, or alternatively, embodiments enable selection of control for debug by the user and for overriding the set of silicon knobs that are needed for current debug in progress. The scheme described herein may dynamically function in various user environments, extending the closed chassis adapter (CCA) and/or USB debug class (DbC)

capability for debug of low power states. Additional or alternative technical effects will be evident from the various figures and embodiments.

In the following description, numerous details are discussed to provide a more thorough explanation of embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical, mechanical, or magnetic connection between the things that are connected, without any intermediary devices. The term "coupled" means either a direct electrical, mechanical, or magnetic connection between the things that are connected or an indirect connection through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about" generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking, or in any other manner.

It is to be understood that the terms so used are interchangeable under appropriate circumstances such that the embodiments of the invention described herein are, for example, capable of operation in other orientations than those illustrated or otherwise described herein.

The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits, modules, and logic blocks are Tunneling FETs (TFETs). Some transistors of various embodiments may comprise metal oxide semiconductor (MOS) transistors, which include drain, source, gate, and bulk terminals. The transistors may also include Tri-Gate and FinFET transistors, Gate All Around Cylindrical Transistors, Square Wire, or Rectangular Ribbon Transistors or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bipolar junction transistors-BJT PNP/NPN, BiCMOS, CMOS, etc., may be used for some transistors without departing from the scope of the disclosure.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

FIG. 1 illustrates a debug setup 100 showing a Debug Test System (DTS) 102 connected to a Target System (TS) 104, in accordance with some embodiments of the disclosure. In embodiments, the TS 104 is to be debugged in low power mode. In some embodiments, ADLLP Debug is achieved by detection of the probe connection between TS 104 and DTS 102 and the debug use case. For example, the DTS 102 may inform the TS 104 of the specific probe connection and/or debug use case. Depending on the type of probe connection, a control circuit of the TS 104 may configure one or more settings of the TS 104. For example, the configuration may include adjusting one or more clock settings, power settings, LVM settings, and/or other suitable settings for that particular Low-Power debug scenario. The control circuit may include, for example, a power management controller (PMC) and/or a circuit that implements a Target System Firmware (TSW), also referred to as Target Firmware (TFW) executing on the TS.

In various embodiments, the probe connection may be, for example, Universal Asynchronous Receiver/Transmitter (UART), inter-integrated circuit (I2C), I3C, Joint Test Action Group (JTAG), Serial Peripheral Interface (SPI), Universal Serial Bus (USB), Thunderbolt, Display Port, High Definition Multimedia Interface (HDMI), Bluetooth, Wi-Fi, Peripheral Component Interconnect (PCI), PCI express (PCIe), and/or another suitable probe connection. The debug use case may be, for example, JTAG Test Access Port (TAP), Run-Control, CrashLog, Streaming Trace, Real-Time Operating System (OS), Triage, CrashDump, and/or another suitable debug use case.

As an example, when the DTS detects a UART probe connected to the Target System, the Debug Host Software informs a power management controller (PMC) or the Target Firmware (TFW) about the UART probe connection and the user's desired debug use-case. TFW dynamically configures the target system to enable the system to enter all the power states and power-gating Trace and Functional circuit blocks (e.g., IPs) while the user is able to read/write registers across the system and triage fundamental issues. This low-power debug minimizes power consumption and perturbation of targets. When the user determines that more visibility is needed, the debug engineer may dynamically switch the connected probe.

In one example, a high bandwidth probe (such as USB3, PCIe, Thunderbolt, etc.) may be connected between the DTS and the TS, and the user wants to trace a Real-Time OS. In this case, the Host Debug Software executing on the DTS may inform the TFW via an interface (e.g., an IPC mailbox and/or another suitable interface) of the connected probe or transports and the TFW dynamically enables power/clocks as well as the trace circuit block required by the transports and use-case, enabling the silicon to enter the low-power states anyway.

As such, the user can dynamically switch debug probes and transports, as well as switch between debug use cases, on the fly by connecting the suitable probe between the DTS and TS. The TSW of the TS maintains security, optimizes power and clock, and enables system to transition through all low-power states and support the user's debug scenarios as needed.

In situations when the debug host detects that tracing circuit blocks (e.g., IP blocks) is not required, the tracing circuit block of the TS is power-gated, thus the power and clock perturbation associated with that circuit block during the debug session is avoided. Now, the debug session is started incrementally by using the simplest probe possible which keeps the smallest number of circuit blocks in TS powered up. Depending upon the low-power debug requirements, if there is a need for the trace circuit block in the TS to be powered up, the appropriate cable is plugged-in which is detected by the debug software of DTS which in turns sends commands to the target firmware of TS to either power-down or power-up the required debug circuit blocks of the TS for the debug sessions.

In some embodiments, the target firmware of the TS applies the overrides as it is a secure-agent, and it does not understand the use-cases. However, the debug software knows the use-cases and it informs the configuration logic of the TS to either turn on or turn off the respective debug circuit blocks of the TS. In this case, the target firmware abstracts some or all the red-access content but manages the low-power as well as clocking overrides.

In some embodiments, the Host Debug Software resides on the Debug Host (or DTS) and the Target Firmware resides on the Target System (which could be an Open-Chassis or Closed-Chassis). When the USB Debug Class Direct Connect Interface-Out of Band (DCI-OOB) Hosting probe is connected for low-power (e.g., S0ix) and S0-state low-power debug, which uses low-bandwidth interfaces (such as UART, SPI, I2C, I3C, etc.), system debug in lowest power states is enabled. In various embodiments, the Host Debug Software differentiates the detection of the GOB (Out-of-Band) connection versus the IB (In-Band) cable connections. In-Band connections between the debug host and the target system use the functional protocols such as, but no limited to, USB2, USB3, Thunderbolt, PCIe, Display Port protocols etc., and may use USB2, USB3, USB Type-A, Micro-USB, USB Type-C receptacle. In-Band connections between the debug host and the target system may use additional power islands to be powered up to provide debug capabilities such as for Run-Control, Trace, etc. Hence, the In-Band connections or capabilities are used for debug in lower-power states and not necessarily lowest power-states, but offer the advantage of high trace bandwidth which are used to debug high-speed traces, for example. The Host Debug Software detects the appropriate probe/transport and communicates with the Target Firmware (TFW) to provide appropriate overrides for low-power debug.

The number of low-power debug cases are so many that the debug time savings by plugging in the required probe for the type of low-power debug tremendously saves debug time as well as throughput. The embodiments enable all OEMs to debug low-power issues in-field as well as RMAs (Return Material Authorizations). These embodiments also allow verification of battery life in products to meet the HOBL (Hours of Battery Life), which is a Microsoft® standard to specify the number of hours that a product has for its battery life.

Figure 2:
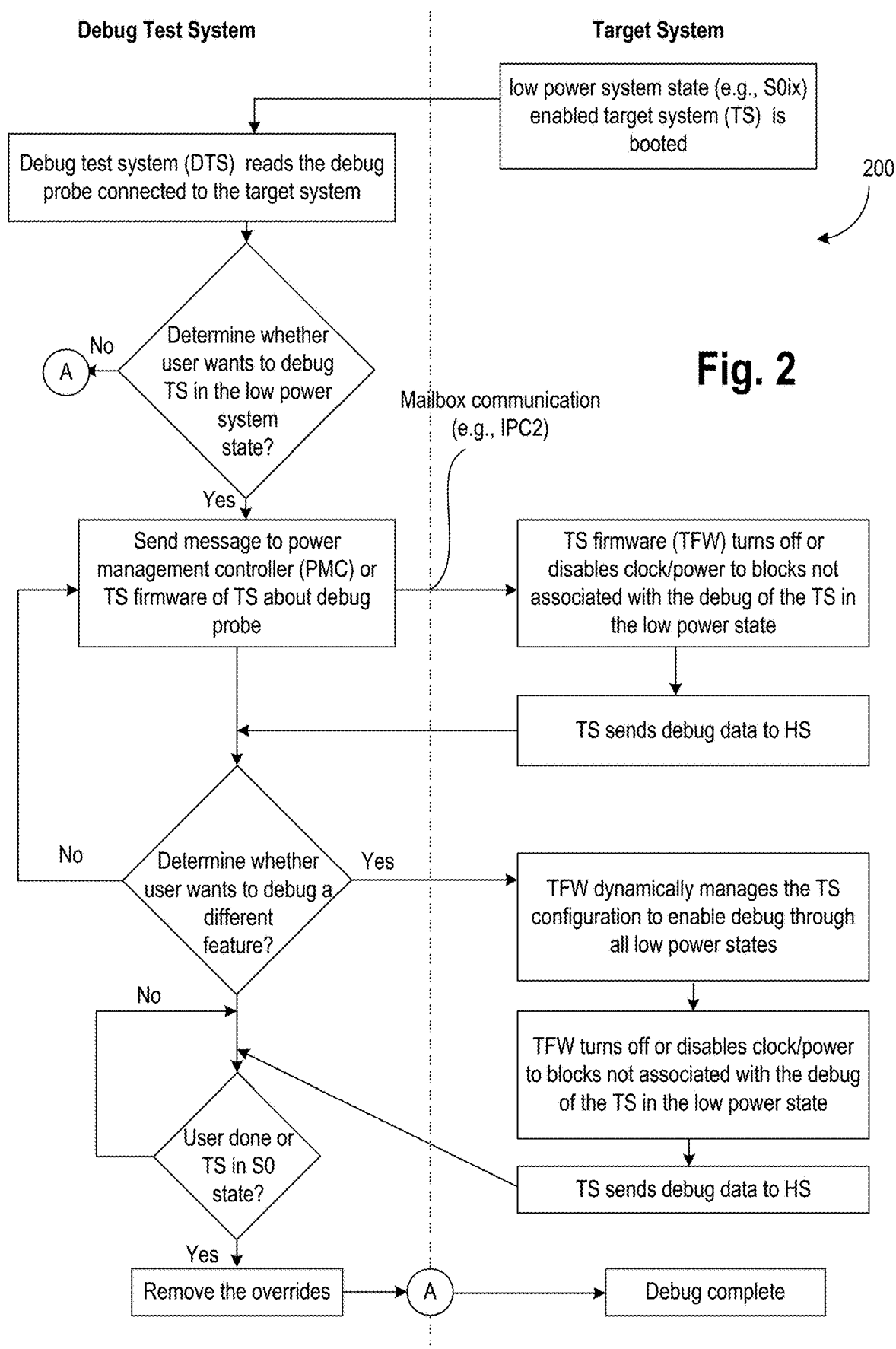
FIG. 2 illustrates a flowchart of Automated Dynamic low voltage monitoring (LVM) based Low-Power (ADLLP) debug, in accordance with some embodiments.

FIG. 2 illustrates a flowchart 200 of Automated Dynamic low voltage monitoring (LVM) based Low-Power (ADLLP) debug, in accordance with some embodiments. While various blocks are shown in a particular order, the order can be modified. For example, some blocks may be executed in parallel to other blocks. Aspects of the process are performed by the DTS (e.g., DTS 102) and the TS (e.g., TS 104). To test the TS for a particular low power debug mode, the TS is enabled and booted and the TS processor is transitioned to low power system state (e.g., S0ix). Depending on the kind of debug, a probe is connected between the TS and the DTS. Table 1 shows an example of the various probes/transports and their capability of testing TS in different power states.

TABLE 1

| Example Debug IF/ Transport | Example Debug Features | S0 | S0 (C0-C2 PC3-C10) | S0 (PC3-PC10) | Sx (Sleep, Hibernate, Soft-Off) | Win-IDLE (IVR) | S0I2.0/ S0i3.0 | S0i2.1-2.3 S0i3.1-3.4 |
|---|---|---|---|---|---|---|---|---|
| JTAG, I2C, I3C | Register RW No Trace | X | X | X | X | X | X | X |
| UART | Register RW | X | X | X | X | X | X | X |
|  | 0.5 Mbps Trace | X | X | X | X | X | TRC OVR | TRC OVR |
| GPIO | Register RW | X | X | X | X | X | X | GPIO OVR |
|  | 12 MBs Trace | X | X | X | X | X | TRC OVR | TRC OVR |
| USB2 | Register RW + 29 MBpsDMA | X | X | X | X | X | X | PHY OVR |
|  | 29 MBps Trace | X | X | X | X | X | TRC OVR | TRC OVR |
| USB3 | Register RW + 400 MBpsDMA | X | X | X | — | — | — | — |
|  | 400 MBpsTrace | X | X | X | — | — | — | — |
| HDMI | 800 MBpsTrace | X | X | — | — | — | — | — |
| TBT | 800 MBpsTrace | X | X | — | — | — | — | — |

Upon connecting the probe, the DTS reads the debug probe connected to the TS and knows the various types of low power tests possible. The DTS determines whether the user wants to debug the TS in S0ix (e.g., platform low power state for the TS). If the user does not want to debug using the particular probe, the process ends. If the user wants to continue with the debug using the connected probe, the DTS sends a message to power management controller (PMC) or TFW of TS about the debug probe. This message is sent from the DTS to the TS via a mailbox communication interface such as IPC2 or another suitable mechanism.

However, other types of interfaces may also be used to communicate between the DTS and TS.

The TS receives the message from the DTS. In response to receiving the message, the TFW turns off or disables the clock and/or power to IP blocks not associated with the low power debug trace. As such, when the debug host detects that tracing circuit block is not required, TFW of the TS power gates the tracing circuit block of the TS. Thus, the power and clock perturbation associated with that circuit block during the debug session is avoided. Now, the debug session is started incrementally by using the simplest probe possible which keeps the smallest number of circuit blocks in TS powered up. The debug data is sent back to the DTS for further processing.

In some embodiments, the software of the DTS determines whether the user wants to further debug the TS for a different feature in the low power state. If the user wants to repeat the debug of the same feature, the DTS sends the message to the PMC or TFW of the TS about the debug probe to get the debug data from the TS. For example, for a different temperature condition, a user may want to debug the same trace in TS. If the user wants to debug a different feature, the target firmware TFW dynamically manages the TS configuration to enable debug through all the low power states that can be handled by the connected probe. Like before, the TFW turns off or disables the clock and/or power to IP blocks not associated with the low power debug trace. As such, when the debug host detects that tracing circuit block is not required, TFW of the TS power gates the tracing circuit block of the TS. The debug data is sent back to the DTS for further processing.

In some embodiments, if the TS enters an active state (e.g., S0 state), then the DTS instructs the TS to remove the overrides that were applied to gate the clocks and/or power rails. This allows the TS to operate in low power mode without the overrides.

Figure 3:
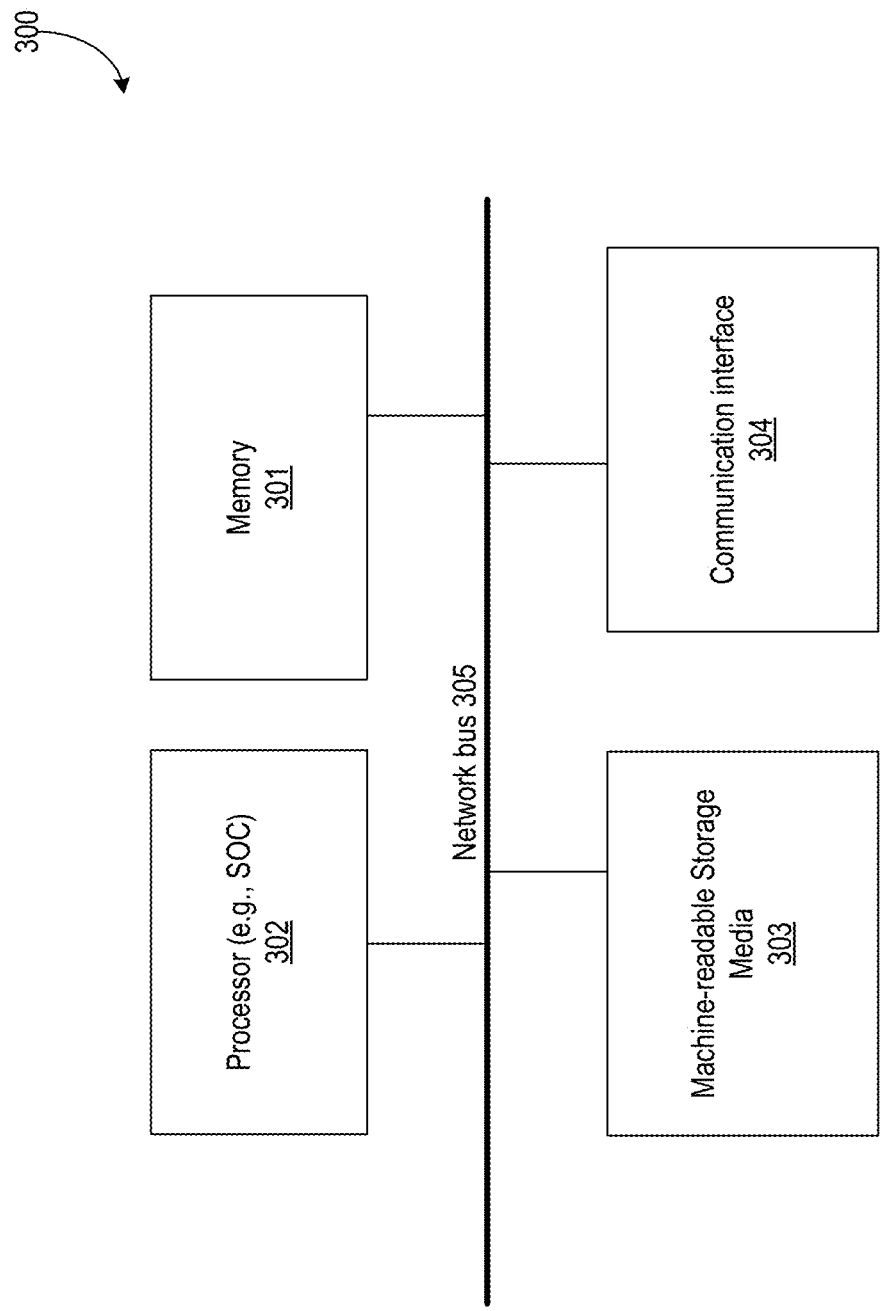
FIG. 3 illustrates a simplified computer system for performing various embodiments herein.

FIG. 3 illustrates a simplified computer system 300 for executing the flowchart, in accordance with some embodiments. Elements of embodiments are also provided as a machine-readable medium (e.g., memory) for storing the computer-executable instructions (e.g., instructions to implement any other processes discussed herein) also referred to as machine-executable instructions. In some embodiments, the computing platform comprises memory 301, processor 302, machine-readable storage media 303 (also referred to as tangible machine readable medium), communication interface 304 (e.g., wireless or wired interface), and network bus 305 coupled together as shown.

In some embodiments, processor 302 is a Digital Signal Processor (DSP), an Application Specific Integrated Circuit (ASIC), a general-purpose Central Processing Unit (CPU), or a low power logic implementing a simple finite state machine to perform the method of various embodiments, etc.

In some embodiments, the various logic blocks of the system are coupled together via network bus 305. Any suitable protocol may be used to implement network bus 305. In some embodiments, machine-readable storage medium 303 includes Instructions (also referred to as the program software code/instructions) for calculating or measuring distance and relative orientation of a device with reference to another device as described with reference to various embodiments and flowchart.

Program software code/instructions associated with the methods and executed to implement embodiments of the disclosed subject matter may be implemented as part of an operating system or a specific application, component, program, object, module, routine, or other sequence of instructions or organization of sequences of instructions referred to as "program software code/instructions," "operating system program software code/instructions," "application program software code/instructions," or simply "software" or firmware embedded in processor. In some embodiments, the program software code/instructions associated with various embodiments are executed by the computing system.

In some embodiments, the program software code/instructions associated with various flowcharts are stored in a computer executable storage medium and executed by processor 302. Here, computer executable storage medium 303 is a tangible machine-readable medium that can be used to store program software code/instructions and data that, when executed by a computing device, causes one or more processors (e.g., processor 302) to perform a method(s) as may be recited in one or more accompanying claims directed to the disclosed subject matter.

Tangible machine-readable medium 303 may include storage of the executable software program code/instructions and data in various tangible locations, including for example ROM, volatile RAM, non-volatile memory and/or cache and/or other tangible memory as referenced in the present application. Portions of this program software code/instructions and/or data may be stored in any one of these storage and memory devices. Further, the program software code/instructions can be obtained from other storage, including, e.g., through centralized servers or peer-to-peer networks and the like, including the Internet. Different portions of the software program code/instructions and data can be obtained at different times and in different communication sessions or in the same communication session.

The software program code/instructions and data can be obtained in their entirety prior to the execution of a respective software program or application by the computing device. Alternatively, portions of the software program code/instructions and data can be obtained dynamically, e.g., just in time, when needed for execution. Alternatively, some combination of these ways of obtaining the software program code/instructions and data may occur, e.g., for different applications, components, programs, objects, modules, routines or other sequences of instructions or organization of sequences of instructions, by way of example. Thus, it is not required that the data and instructions be on a tangible machine-readable medium in entirety at a particular instance of time.

Examples of tangible computer-readable media 303 include but are not limited to recordable and non-recordable type media such as volatile and non-volatile memory devices, read only memory (ROM), random access memory (RAM), flash memory devices, floppy and other removable disks, magnetic storage media, optical storage media (e.g., Compact Disk Read-Only Memory (CD ROMS), Digital Versatile Disks (DVDs), etc.), among others. The software program code/instructions may be temporarily stored in digital tangible communication links while implementing electrical, optical, acoustical or other forms of propagating signals, such as carrier waves, infrared signals, digital signals, etc. through such tangible communication links.

In general, tangible machine readable medium 303 includes any tangible mechanism that provides (i.e., stores and/or transmits in digital form, e.g., data packets) information in a form accessible by a machine (i.e., a computing device), which may be included, e.g., in a communication device, a computing device, a network device, a personal digital assistant, a manufacturing tool, a mobile communication device, whether or not able to download and run applications and subsidized applications from the communication network, such as the Internet, e.g., an iPhone®, Galaxy®, Blackberry® Droid®, or the like, or any other device including a computing device. In one embodiment, processor-based system is in a form of or included within a PDA (personal digital assistant), a cellular phone, a notebook computer, a tablet, a game console, a set top box, an embedded system, a TV (television), a personal desktop computer, etc. Alternatively, the traditional communication applications and subsidized application(s) may be used in some embodiments of the disclosed subject matter.

In some embodiments, the machine-readable storage media 303 has machine executable instructions that when executed cause one or more machines to perform a method comprising: sending a message to a target system in low power mode that a probe is connected between a debug host system and the target system, wherein the target system is to disable or override clock and/or power rail to one or more intellectual property blocks unrelated to a debug trace in the target system; and receiving debug data from the target system according to a type of the probe. In some embodiments, the target system is in S0ix power state before the probe is connected to the target system.

In some embodiments, the probe is one of: UART, I2C, I3C, JTAG, SPI, USB, Thunderbolt, Display Port, HDMI, Bluetooth, Wi-Fi, PCI, or PCIe. In some embodiments, for each probe there is a debug use-case, which includes one of: JTAG TAP (Test Access Port), Run-Control, CrashLog, Streaming Trace, Real-Time OS, Triage, or CrashDump. In some embodiments, the message is sent to the target system via a mailbox communication protocol. In some embodiments, the mailbox communication protocol is an IPC2 protocol. In some embodiments, method further comprises: determining whether an additional or different feature of the target system is to be debugged; and instructing the target system to dynamically debug a trace of the additional or different feature. In some embodiments, method further comprises: determining whether the target system is in active state; and sending instructions to the TS to remove override to clock and/or power rail in response to determining that the target system is in active state.

Figure 4:
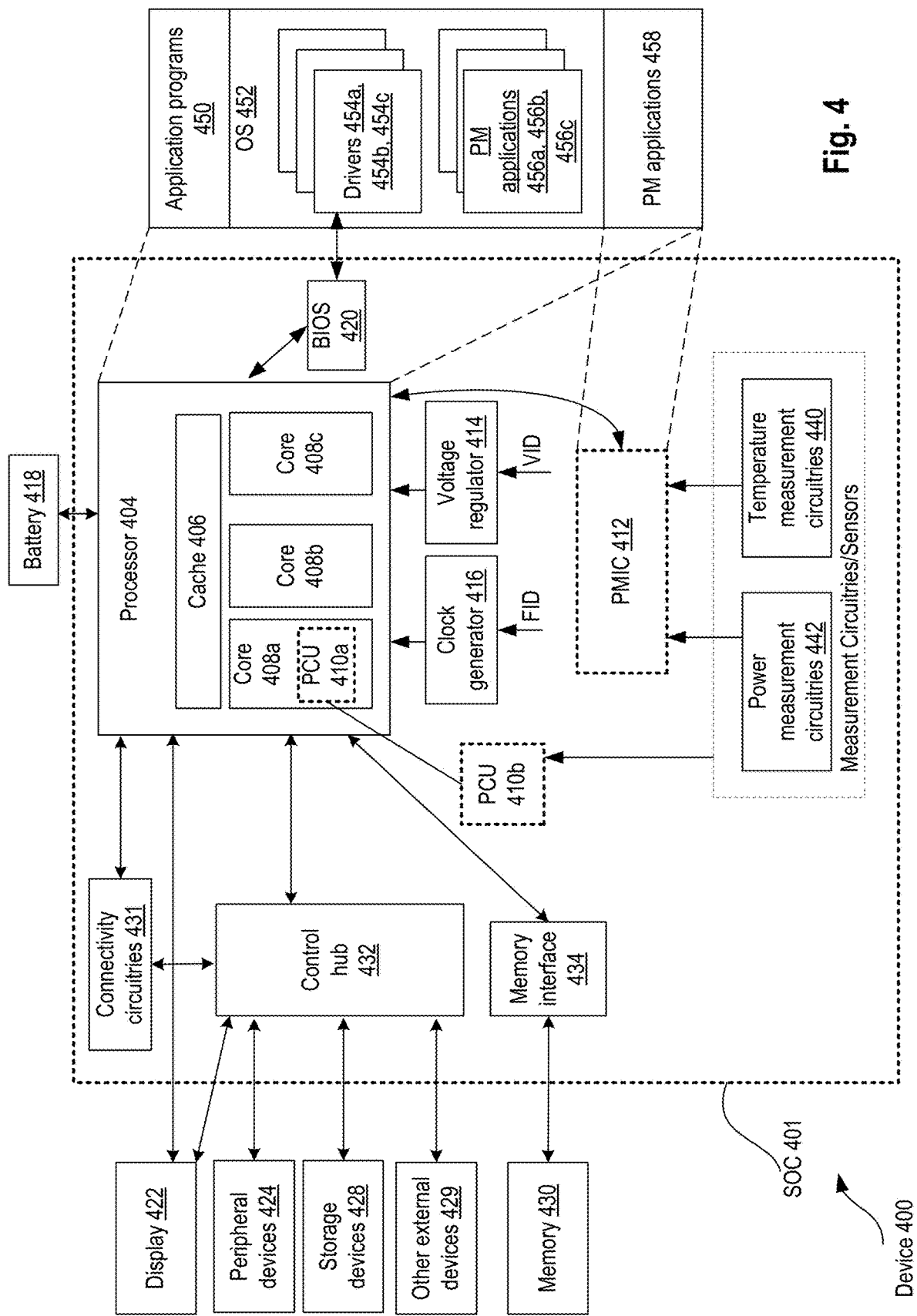
FIG. 4 illustrates a computer system or computing device with mechanisms for ADLLP debug, in accordance with some embodiments.

FIG. 4 illustrates a computer system or computing device with mechanisms for Automated Dynamic low voltage monitoring (LVM) based Low-Power (ADLLP) debug, in accordance with some embodiments. It is pointed out that those elements of FIG. 4 having the same reference numbers (or names) as the elements of any other figure may operate or function in any manner similar to that described, but are not limited to such.

In some embodiments, device 400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 400.

In an example, the device 400 comprises an SoC (System-on-Chip) 401. An example boundary of the SOC 401 is illustrated using dotted lines in FIG. 4, with some example components being illustrated to be included within SOC 401—however, SOC 401 may include any appropriate components of device 400.

In some embodiments, device 400 includes processor 404. Processor 404 can include one or more physical devices, such as microprocessors, application processors, microcontrollers, programmable logic devices, processing cores, or other processing means. The processing operations performed by processor 404 include the execution of an operating platform or operating system on which applications and/or device functions are executed. The processing operations include operations related to I/O (input/output) with a human user or with other devices, operations related to power management, operations related to connecting computing device 400 to another device, and/or the like. The processing operations may also include operations related to audio I/O and/or display I/O.

In some embodiments, processor 404 includes multiple processing cores (also referred to as cores) 408a, 408b, 408c. Although merely three cores 408a, 408b, 408c are illustrated in FIG. 4, processor 404 may include any other appropriate number of processing cores, e.g., tens, or even hundreds of processing cores. Processor cores 408a, 408b, 408c may be implemented on a single integrated circuit (IC) chip. Moreover, the chip may include one or more shared and/or private caches, buses or interconnections, graphics and/or memory controllers, or other components.

In some embodiments, processor 404 includes cache 406. In an example, sections of cache 406 may be dedicated to individual cores 408 (e.g., a first section of cache 406 dedicated to core 408a, a second section of cache 406 dedicated to core 408b, and so on). In an example, one or more sections of cache 406 may be shared among two or more of cores 408. Cache 406 may be split in different levels, e.g., level 1 (L1) cache, level 2 (L2) cache, level 3 (L3) cache, etc.

In some embodiments, processor core 404 may include a fetch unit to fetch instructions (including instructions with conditional branches) for execution by the core 404. The instructions may be fetched from any storage devices such as the memory 430. Processor core 404 may also include a decode unit to decode the fetched instruction. For example, the decode unit may decode the fetched instruction into a plurality of micro-operations. Processor core 404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 404 may be an out-of-order processor core in one embodiment. Processor core 404 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 404 may also include a bus unit to enable communication between components of processor core 404 and other components via one or more buses. Processor core 404 may also include one or more registers to store data accessed by various components of the core 404 (such as values related to assigned app priorities and/or sub-system states (modes) association.

In some embodiments, device 400 comprises connectivity circuitries 431. For example, connectivity circuitries 431 includes hardware devices (e.g., wireless and/or wired connectors and communication hardware) and/or software components (e.g., drivers, protocol stacks), e.g., to enable device 400 to communicate with external devices. Device 400 may be separate from the external devices, such as other computing devices, wireless access points or base stations, etc.

In an example, connectivity circuitries 431 may include multiple different types of connectivity. To generalize, the connectivity circuitries 431 may include cellular connectivity circuitries, wireless connectivity circuitries, etc. Cellular connectivity circuitries of connectivity circuitries 431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 431 may include a network interface, such as a wired or wireless interface, e.g., so that a system embodiment may be incorporated into a wireless device, for example, a cell phone or personal digital assistant.

In some embodiments, device 400 comprises control hub 432, which represents hardware devices and/or software components related to interaction with one or more I/O devices. For example, processor 404 may communicate with one or more of display 422, one or more peripheral devices 44, storage devices 428, one or more other external devices 429, etc., via control hub 432. Control hub 432 may be a chipset, a Platform Control Hub (PCH), and/or the like.

For example, control hub 432 illustrates one or more connection points for additional devices that connect to device 400, e.g., through which a user might interact with the system. For example, devices (e.g., devices 429) that can be attached to device 400 include microphone devices, speaker or stereo systems, audio devices, video systems or other display devices, keyboard or keypad devices, or other I/O devices for use with specific applications such as card readers or other devices.

As mentioned above, control hub 432 can interact with audio devices, display 422, etc. For example, input through a microphone or other audio device can provide input or commands for one or more applications or functions of device 400. Additionally, audio output can be provided instead of, or in addition to display output. In another example, if display 422 includes a touch screen, display 422 also acts as an input device, which can be at least partially managed by control hub 432. There can also be additional buttons or switches on computing device 400 to provide I/O functions managed by control hub 432. In one embodiment, control hub 432 manages devices such as accelerometers, cameras, light sensors or other environmental sensors, or other hardware that can be included in device 400. The input can be part of direct user interaction, as well as providing environmental input to the system to influence its operations (such as filtering for noise, adjusting displays for brightness detection, applying a flash for a camera, or other features).

In some embodiments, control hub 432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 422 represents hardware (e.g., display devices) and software (e.g., drivers) components that provide a visual and/or tactile display for a user to interact with device 400. Display 422 may include a display interface, a display screen, and/or hardware device used to provide a display to a user. In some embodiments, display 422 includes a touch screen (or touch pad) device that provides both output and input to a user. In an example, display 422 may communicate directly with the processor 404. Display 422 can be one or more of an internal display device, as in a mobile electronic device or a laptop device or an external display device attached via a display interface (e.g., DisplayPort, etc.). In one embodiment display 422 can be a head mounted display (HMD) such as a stereoscopic display device for use in virtual reality (VR) applications or augmented reality (AR) applications.

In some embodiments, and although not illustrated in the figure, in addition to (or instead of) processor 404, device 400 may include Graphics Processing Unit (GPU) comprising one or more graphics processing cores, which may control one or more aspects of displaying contents on display 422.

Control hub 432 (or platform controller hub) may include hardware interfaces and connectors, as well as software components (e.g., drivers, protocol stacks) to make peripheral connections, e.g., to peripheral devices 424.

It will be understood that device 400 could both be a peripheral device to other computing devices, as well as have peripheral devices connected to it. Device 400 may have a "docking" connector to connect to other computing devices for purposes such as managing (e.g., downloading and/or uploading, changing, synchronizing) content on device 400. Additionally, a docking connector can allow device 400 to connect to certain peripherals that allow computing device 400 to control content output, for example, to audiovisual or other systems.

In addition to a proprietary docking connector or other proprietary connection hardware, device 400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 431 may be coupled to control hub 432, e.g., in addition to, or instead of, being coupled directly to the processor 404. In some embodiments, display 422 may be coupled to control hub 432, e.g., in addition to, or instead of, being coupled directly to processor 404.

In some embodiments, device 400 comprises memory 430 coupled to processor 404 via memory interface 434. Memory 430 includes memory devices for storing information in device 400.

In some embodiments, memory 430 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 430 can be a dynamic random access memory (DRAM) device, a static random access memory (SRAM) device, flash memory device, phase-change memory device, or some other memory device having suitable performance to serve as process memory. In one embodiment, memory 430 can operate as system memory for device 400, to store data and instructions for use when the one or more processors 404 executes an application or process. Memory 430 can store application data, user data, music, photos, documents, or other data, as well as system data (whether long-term or temporary) related to the execution of the applications and functions of device 400.

Elements of various embodiments and examples are also provided as a machine-readable medium (e.g., memory 430) for storing the computer-executable instructions (e.g., instructions to implement any other processes discussed herein). The machine-readable medium (e.g., memory 430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 400 comprises temperature measurement circuitries 440, e.g., for measuring temperature of various components of device 400. In an example, temperature measurement circuitries 440 may be embedded, or coupled or attached to various components, whose temperature are to be measured and monitored. For example, temperature measurement circuitries 440 may measure temperature of (or within) one or more cores 408a, 408b, 408c, voltage regulator 414, memory 430, a mother-board of SOC 401, and/or any appropriate component of device 400.

In some embodiments, device 400 comprises power measurement circuitries 442, e.g., for measuring power consumed by one or more components of the device 400. In an example, in addition to, or instead of, measuring power, the power measurement circuitries 442 may measure voltage and/or current. In an example, the power measurement circuitries 442 may be embedded, or coupled or attached to various components, whose power, voltage, and/or current consumption are to be measured and monitored. For example, power measurement circuitries 442 may measure power, current and/or voltage supplied by one or more voltage regulators 414, power supplied to SOC 401, power supplied to device 400, power consumed by processor 404 (or any other component) of device 400, etc.

In some embodiments, device 400 comprises one or more voltage regulator circuitries, generally referred to as voltage regulator (VR) 414. VR 414 generates signals at appropriate voltage levels, which may be supplied to operate any appropriate components of the device 400. Merely as an example, VR 414 is illustrated to be supplying signals to processor 404 of device 400. In some embodiments, VR 414 receives one or more Voltage Identification (VID) signals, and generates the voltage signal at an appropriate level, based on the VID signals. Various type of VRs may be utilized for the VR 414. For example, VR 414 may include a "buck" VR, "boost" VR, a combination of buck and boost VRs, low dropout (LDO) regulators, switching DC-DC regulators, constant-on-time controller-based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 410a/b and/or PMIC 412. In some embodiments, each core has a network of distributed LDOs to provide efficient control for power management. The LDOs can be digital, analog, or a combination of digital or analog LDOs. In some embodiments, VR 414 includes current tracking apparatus to measure current through power supply rail(s).

In some embodiments, device 400 comprises one or more clock generator circuitries, generally referred to as clock generator 416. Clock generator 416 generates clock signals at appropriate frequency levels, which may be supplied to any appropriate components of device 400. Merely as an example, clock generator 416 is illustrated to be supplying clock signals to processor 404 of device 400. In some embodiments, clock generator 416 receives one or more Frequency Identification (FID) signals, and generates the clock signals at an appropriate frequency, based on the FID signals.

In some embodiments, device 400 comprises battery 418 supplying power to various components of device 400. Merely as an example, battery 418 is illustrated to be supplying power to processor 404. Although not illustrated in the figures, device 400 may comprise a charging circuitry, e.g., to recharge the battery, based on Alternating Current (AC) power supply received from an AC adapter.

In some embodiments, device 400 comprises Power Control Unit (PCU) 410 (also referred to as Power Management Unit (PMU), Power Controller, etc.). In an example, some sections of PCU 410 may be implemented by one or more processing cores 408, and these sections of PCU 410 are symbolically illustrated using a dotted box and labelled PCU 410a. In an example, some other sections of PCU 410 may be implemented outside the processing cores 408, and these sections of PCU 410 are symbolically illustrated using a dotted box and labelled as PCU 410b. PCU 410 may implement various power management operations for device 400. PCU 410 may include hardware interfaces, hardware circuitries, connectors, registers, etc., as well as software components (e.g., drivers, protocol stacks), to implement various power management operations for device 400.

In some embodiments, device 400 comprises Power Management Integrated Circuit (PMIC) 412, e.g., to implement various power management operations for device 400. In some embodiments, PMIC 412 is a Reconfigurable Power Management ICs (RPMICs) and/or an IMVP (Intel® Mobile Voltage Positioning). In an example, the PMIC is within an IC chip separate from processor 404. The may implement various power management operations for device 400. PMIC 412 may include hardware interfaces, hardware circuitries, connectors, registers, etc., as well as software components (e.g., drivers, protocol stacks), to implement various power management operations for device 400.

In an example, device 400 comprises one or both PCU 410 or PMIC 412. In an example, any one of PCU 410 or PMIC 412 may be absent in device 400, and hence, these components are illustrated using dotted lines.

Various power management operations of device 400 may be performed by PCU 410, by PMIC 412, or by a combination of PCU 410 and PMIC 412. For example, PCU 410 and/or PMIC 412 may select a power state (e.g., P-state) for various components of device 400. For example, PCU 410 and/or PMIC 412 may select a power state (e.g., in accordance with the ACPI (Advanced Configuration and Power Interface) specification) for various components of device 400. Merely as an example, PCU 410 and/or PMIC 412 may cause various components of the device 400 to transition to a sleep state, to an active state, to an appropriate C state (e.g., C0 state, or another appropriate C state, in accordance with the ACPI specification), etc. In an example, PCU 410 and/or PMIC 412 may control a voltage output by VR 414 and/or a frequency of a clock signal output by the clock generator, e.g., by outputting the VID signal and/or the FID signal, respectively. In an example, PCU 410 and/or PMIC 412 may control battery power usage, charging of battery 418, and features related to power saving operation.

The clock generator 416 can comprise a phase locked loop (PLL), frequency locked loop (FLL), or any suitable clock source. In some embodiments, each core of processor 404 has its own clock source. As such, each core can operate at a frequency independent of the frequency of operation of the other core. In some embodiments, PCU 410 and/or PMIC 412 performs adaptive or dynamic frequency scaling or adjustment. For example, clock frequency of a processor core can be increased if the core is not operating at its maximum power consumption threshold or limit. In some embodiments, PCU 410 and/or PMIC 412 determines the operating condition of each core of a processor, and opportunistically adjusts frequency and/or power supply voltage of that core without the core clocking source (e.g., PLL of that core) losing lock when the PCU 410 and/or PMIC 412 determines that the core is operating below a target performance level. For example, if a core is drawing current from a power supply rail less than a total current allocated for that core or processor 404, then PCU 410 and/or PMIC 412 can temporality increase the power draw for that core or processor 404 (e.g., by increasing clock frequency and/or power supply voltage level) so that the core or processor 404 can perform at higher performance level. As such, voltage and/or frequency can be increased temporality for processor 404 without violating product reliability.

In an example, PCU 410 and/or PMIC 412 may perform power management operations, e.g., based at least in part on receiving measurements from power measurement circuitries 442, temperature measurement circuitries 440, charge level of battery 418, and/or any other appropriate information that may be used for power management. To that end, PMIC 412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 410 and/or PMIC 412 in at least one embodiment to allow PCU 410 and/or PMIC 412 to manage processor core energy at least in part based on value(s) detected by one or more of the sensors.

Also illustrated is an example software stack of device 400 (although not all elements of the software stack are illustrated). Merely as an example, processors 404 may execute application programs 450, Operating System (OS) 452, one or more Power Management (PM) specific application programs (e.g., generically referred to as PM applications 458), and/or the like. PM applications 458 may also be executed by the PCU 410 and/or PMIC 412. OS 452 may also include one or more PM applications 456a, 456b, 456c. The OS 452 may also include various drivers 454a, 454b, 454c, etc., some of which may be specific for power management purposes. In some embodiments, device 400 may further comprise a Basic Input/output System (BIOS) 420. BIOS 420 may communicate with OS 452 (e.g., via one or more drivers 454), communicate with processors 404, etc.

For example, one or more of PM applications 458, 456, drivers 454, BIOS 420, etc. may be used to implement power management specific tasks, e.g., to control voltage and/or frequency of various components of device 400, to control wake-up state, sleep state, and/or any other appropriate power state of various components of device 400, control battery power usage, charging of the battery 418, features related to power saving operation, etc.

In some embodiments, pCode executing on PCU 410a/b has a capability to enable extra compute and telemetries resources for the runtime support of the pCode. Here pCode refers to a firmware executed by PCU 410a/b to manage performance of the 401. For example, pCode may set frequencies and appropriate voltages for the processor. Part of the pCode are accessible via OS 452. In various embodiments, mechanisms and methods are provided that dynamically change an Energy Performance Preference (EPP) value based on workloads, user behavior, and/or system conditions. There may be a well-defined interface between OS 452 and the pCode. The interface may allow or facilitate the software configuration of several parameters and/or may provide hints to the pCode. As an example, an EPP parameter may inform a pCode algorithm as to whether performance or battery life is more important.

This support may be done as well by the OS 452 by including machine-learning support as part of OS 452 and either tuning the EPP value that the OS hints to the hardware (e.g., various components of SCO 401) by machine-learning prediction, or by delivering the machine-learning prediction to the pCode in a manner similar to that done by a Dynamic Tuning Technology (DTT) driver. In this model, OS 452 may have visibility to the same set of telemetries as are available to a DTT. As a result of a DTT machine-learning hint setting, pCode may tune its internal algorithms to achieve optimal power and performance results following the machine-learning prediction of activation type. The pCode as example may increase the responsibility for the processor utilization change to enable fast response for user activity, or may increase the bias for energy saving either by reducing the responsibility for the processor utilization or by saving more power and increasing the performance lost by tuning the energy saving optimization. This approach may facilitate saving more battery life in case the types of activities enabled lose some performance level over what the system can enable. The pCode may include an algorithm for dynamic EPP that may take the two inputs, one from OS 452 and the other from software such as DTT, and may selectively choose to provide higher performance and/or responsiveness. As part of this method, the pCode may enable in the DTT an option to tune its reaction for the DTT for different types of activity.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an integrated circuit comprising: a plurality of circuit blocks; and a control circuit coupled to the plurality of circuit blocks. The control circuit to: identify a probe type of a probe that connects the integrated circuit to a debug test system; identify a debug use case to be used by the debug test system; and control at least one of a clock setting, a power setting, or a low voltage mode setting of one or more of the circuit blocks based on the probe type and the debug use case.

Example 2 is the integrated circuit of Example 1, wherein the integrated circuit is in a low voltage mode when the debug test system is connected.

Example 3 is the integrated circuit of Example 1, wherein the probe type and the debug use case are determined based on a message received from the debut test system.

Example 4 is the integrated circuit of Example 3, wherein the message is received via a mailbox communication protocol.

Example 5 is the integrated circuit of Example 4, wherein the mailbox communication protocol is an inter process communication (IPC) protocol.

Example 6 is the integrated circuit of Example 1, wherein the control circuit is included in a power management controller.

Example 7 is the integrated circuit of Example 1, wherein the control circuit is to provide debug data to the debug test system in accordance with the probe type and the debug use case.

Example 8 is the integrated circuit of Example 1, wherein the debug use case is identified at least partially based on the identified probe type.

Example 9 is the integrated circuit of Example 1, wherein the probe type is Universal Asynchronous Receiver/Transmitter (UART), inter-integrated circuit (I2C), I3C, Joint Test Action Group (JTAG), Serial Peripheral Interface (SPI), Universal Serial Bus (USB), Thunderbolt, Display Port, High Definition Multimedia Interface (HDMI), Bluetooth, Wi-Fi, Peripheral Component Interconnect (PCI), or PCI express (PCIe).

Example 10 is the integrated circuit of Example 1, wherein the debug use case includes a JTAG Test Action Port (TAP), Run-Control, CrashLog, Streaming Trace, Real-Time Operating System (OS), Triage, or CrashDump.

Example 11 is one or more non-transitory computer-readable storage media having instructions, stored thereon, that when executed cause a device to: send a message to a target system in a low power state to indicate a probe type of a probe that is connected between a debug host system and the target system to trigger the target system to disable or override at least one of a clock or a power rail to one or more circuit blocks that are unrelated to a debug trace in the target system; and receive debug data from the target system according to the probe type.

Example 12 is the one or more non-transitory computer-readable storage media of Example 11, wherein the target system is in the low power state when the probe is connected to the target system.

Example 13 is the one or more non-transitory computer-readable storage media of Example 11, wherein the probe type is Universal Asynchronous Receiver/Transmitter (UART), inter-integrated circuit (I2C), I3C, Joint Test Action Group (JTAG), Serial Peripheral Interface (SPI), Universal Serial Bus (USB), Thunderbolt, Display Port, High Definition Multimedia Interface (HDMI), Bluetooth, Wi-Fi, Peripheral Component Interconnect (PCI), or PCI express (PCIe).

Example 14 is the one or more non-transitory computer-readable storage media of Example 11, wherein the instructions, when executed, are further to cause the device to indicate a debug use case to the target system.

Example 15 is the one or more non-transitory computer-readable storage media of Example 14, wherein the debug use case includes a JTAG Test Action Port (TAP), Run-Control, CrashLog, Streaming Trace, Real-Time Operating System (OS), Triage, or CrashDump.

Example 16 is the one or more non-transitory computer-readable storage media of Example 11, wherein the message is sent to the target system via a mailbox communication protocol.

Example 17 is the one or more non-transitory computer-readable storage media of Example 16, wherein the mailbox communication protocol is an inter-process communication 2 (IPC2) protocol.

Example 18 is the one or more non-transitory computer-readable storage media of Example 11, wherein the instructions, when executed, are further to cause the device to: determine whether an additional feature of the target system is to be debugged; and instruct the target system to dynamically debug a trace of the additional feature.

Example 19 is the one or more non-transitory computer-readable storage media of Example 11, wherein the instructions, when executed, are further to cause the device to: determine whether the target system is in an active state; and send instructions to the target system to remove the override of the at least one of the clock or power rail in response to the determination that the target system is in the active state.

Example 20 is one or more non-transitory computer-readable storage media having instructions, stored thereon, that when executed cause an integrated circuit to: receive, from a debug test system that is connected to the integrated circuit via a probe for debug of one or more low power states of the integrated circuit, an indication of a probe type of the probe and a debug use case; and control at least one of a clock setting, a power setting, or a low voltage mode setting of one or more circuit blocks of the integrated circuit based on the probe type and the debug use case.

Example 21 is the one or more non-transitory computer-readable storage media of Example 20, wherein the indication is received via a mailbox communication protocol.

Example 22 is the one or more non-transitory computer-readable storage media of Example 20, wherein the instructions, when executed, are further to cause the integrated circuit to provide debug data to the debug test system in accordance with the probe type and the debug use case.

Example 23 is the one or more non-transitory computer-readable storage media of Example 20, wherein the probe type is Universal Asynchronous Receiver/Transmitter (UART), inter-integrated circuit (I2C), I3C, Joint Test Action Group (JTAG), Serial Peripheral Interface (SPI), Universal Serial Bus (USB), Thunderbolt, Display Port, High Definition Multimedia Interface (HDMI), Bluetooth, Wi-Fi, Peripheral Component Interconnect (PCI), or PCI express (PCIe).

Example 24 is the one or more non-transitory computer-readable storage media of Example 23, wherein the debug use case includes a JTAG Test Action Port (TAP), Run-Control, CrashLog, Streaming Trace, Real-Time Operating System (OS), Triage, or CrashDump.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

The invention claimed is:

1. An integrated circuit, comprising:
a plurality of circuit blocks; and
a control circuit coupled to the plurality of circuit blocks, the control circuit to:
identify a probe type of a probe that connects the integrated circuit to a debug test system;
identify a debug use case to be used by the debug test system; and
turn off or disable at least one of a clock or a power to one or more circuit blocks of the plurality of circuit blocks which are not associated with the probe type and the debug use case.

2. The integrated circuit of claim 1, wherein the integrated circuit is in a low voltage mode when the debug test system is connected.

3. The integrated circuit of claim 1, wherein the probe type and the debug use case are determined based on a message received from the debug test system.

4. The integrated circuit of claim 3, wherein the message is received via a mailbox communication protocol.

5. The integrated circuit of claim 4, wherein the mailbox communication protocol is an inter process communication (IPC) protocol.

6. The integrated circuit of claim 1, wherein the control circuit is included in a power management controller.

7. The integrated circuit of claim 1, wherein the control circuit is to provide debug data to the debug test system in accordance with the probe type and the debug use case.

8. The integrated circuit of claim 1, wherein the debug use case is identified at least partially based on the identified probe type.

9. The integrated circuit of claim 1, wherein the probe type is Universal Asynchronous Receiver/Transmitter (UART), inter-integrated circuit (I2C), I3C, Joint Test Action Group (JTAG), Serial Peripheral Interface (SPI), Universal Serial Bus (USB), Thunderbolt, Display Port, High Definition Multimedia Interface (HDMI), Bluetooth, Wi-Fi, Peripheral Component Interconnect (PCI), or PCI express (PCIe).

10. The integrated circuit of claim 1, wherein the debug use case includes a JTAG Test Action Port (TAP), Run-Control, CrashLog, Streaming Trace, Real-Time Operating System (OS), Triage, or CrashDump.

11. One or more non-transitory computer-readable storage media having instructions, stored thereon, that when executed cause a device to:
send a message to a target system in a low power state to indicate a probe type of a probe that is connected between a debug host system and the target system to trigger the target system to disable or override at least one of a clock or a power rail to one or more circuit blocks that are unrelated to a debug trace in the target system; and
receive debug data from the target system according to the probe type.

12. The one or more non-transitory computer-readable storage media of claim 11, wherein the target system is in the low power state when the probe is connected to the target system.

13. The one or more non-transitory computer-readable storage media of claim 11, wherein the probe type is Universal Asynchronous Receiver/Transmitter (UART), inter-integrated circuit (I2C), I3C, Joint Test Action Group (JTAG), Serial Peripheral Interface (SPI), Universal Serial Bus (USB), Thunderbolt, Display Port, High Definition Multimedia Interface (HDMI), Bluetooth, Wi-Fi, Peripheral Component Interconnect (PCI), or PCI express (PCIe).

14. The one or more non-transitory computer-readable storage media of claim 11, wherein the instructions, when executed, are further to cause the device to indicate a debug use case to the target system.

15. The one or more non-transitory computer-readable storage media of claim 14, wherein the debug use case includes a JTAG Test Action Port (TAP), Run-Control, CrashLog, Streaming Trace, Real-Time Operating System (OS), Triage, or CrashDump.

16. The one or more non-transitory computer-readable storage media of claim 11, wherein the message is sent to the target system via a mailbox communication protocol.

17. The one or more non-transitory computer-readable storage media of claim 16, wherein the mailbox communication protocol is an inter-process communication 2 (IPC2) protocol.

18. The one or more non-transitory computer-readable storage media of claim 11, wherein the instructions, when executed, are further to cause the device to:
  determine whether an additional feature of the target system is to be debugged; and
  instruct the target system to dynamically debug a trace of the additional feature.

19. The one or more non-transitory computer-readable storage media of claim 11, wherein the instructions, when executed, are further to cause the device to:
  determine whether the target system is in an active state; and
  send instructions to the target system to remove the override of the at least one of the clock or power rail in response to the determination that the target system is in the active state.

20. One or more non-transitory computer-readable storage media having instructions, stored thereon, that when executed cause an integrated circuit to:
  receive, from a debug test system that is connected to the integrated circuit via a probe for debug of one or more low power states of the integrated circuit, an indication of a probe type of the probe and a debug use case;
  identify one or more circuit blocks of the integrated circuit which are not to be debugged with the probe type and the debug use case; and
  control at least one of a clock setting, a power setting, or a low voltage mode setting of the one or more circuit blocks of the integrated circuit which are not to be debugged with the probe type and the debug use case.

21. The one or more non-transitory computer-readable storage media of claim 20, wherein the indication is received via a mailbox communication protocol.

22. The one or more non-transitory computer-readable storage media of claim 20, wherein the instructions, when executed, are further to cause the integrated circuit to provide debug data to the debug test system in accordance with the probe type and the debug use case.

23. The one or more non-transitory computer-readable storage media of claim 20, wherein the probe type is Universal Asynchronous Receiver/Transmitter (UART), inter-integrated circuit (I2C), I3C, Joint Test Action Group (JTAG), Serial Peripheral Interface (SPI), Universal Serial Bus (USB), Thunderbolt, Display Port, High Definition Multimedia Interface (HDMI), Bluetooth, Wi-Fi, Peripheral Component Interconnect (PCI), or PCI express (PCIe).

24. The one or more non-transitory computer-readable storage media of claim 23, wherein the debug use case includes a JTAG Test Action Port (TAP), Run-Control, CrashLog, Streaming Trace, Real-Time Operating System (OS), Triage, or CrashDump.

* * * * *